United States Patent
Chen (10) Patent No.: US 11,223,172 B2
(45) Date of Patent: Jan. 11, 2022

(54) EMBEDDED ELECTRICAL SUPPLY PLUG, ELECTRICAL SUPPLY SUPPORT ARM, AND RACK ELECTRICAL SUPPLY SYSTEM

(71) Applicants: Self Electronics Co., Ltd., Zhejiang (CN); Wanjiong Lin, Zhejiang (CN); Self electronics USA Corporation, Norcross, GA (US)

(72) Inventor: Dong Chen, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 45 days.

(21) Appl. No.: 16/835,145

(22) Filed: Mar. 30, 2020

(65) Prior Publication Data
US 2021/0057858 A1 Feb. 25, 2021

(30) Foreign Application Priority Data

Aug. 23, 2019 (CN) .......................... 201910785832.1

(51) Int. Cl.
| | |
|---|---|
| H01R 31/06 | (2006.01) |
| H01R 12/70 | (2011.01) |
| H01R 13/74 | (2006.01) |
| H01R 25/16 | (2006.01) |
| H05K 7/18 | (2006.01) |

(52) U.S. Cl.
CPC ......... *H01R 31/06* (2013.01); *H01R 12/7011* (2013.01); *H01R 12/7088* (2013.01); *H01R 13/746* (2013.01); *H01R 25/162* (2013.01); *H05K 7/18* (2013.01)

(58) Field of Classification Search
CPC ................ H01R 31/06; H01R 12/7011; H01R 12/7088; H01R 13/74; H01R 13/746; H01R 25/162; H01R 13/2435; H01R 2103/00; H01R 13/2442; H01R 13/73; H01R 13/04; H01R 13/40; H01R 24/00; H01R 13/627; H01R 13/629; H01R 13/502; H05K 7/18; A47B 57/42; A47B 96/061; A47B 96/1408; A47B 2220/0091; A47F 5/103; A47F 11/10; F21V 21/35; F21V 23/06

USPC .......................... 439/544, 545, 546, 550, 551
See application file for complete search history.

(56) References Cited

U.S. PATENT DOCUMENTS

| | | | | |
|---|---|---|---|---|
| 4,973,796 A | * | 11/1990 | Dougherty | ................ E04B 2/82 174/494 |
| 5,348,485 A | * | 9/1994 | Briechle | ................ H01R 25/14 439/110 |

(Continued)

*Primary Examiner* — Travis S Chambers
(74) *Attorney, Agent, or Firm* — Wang Law Firm, Inc.

(57) ABSTRACT

An embedded electrical supply plug has a mounting base and a fastener connected to each other, wherein the mounting base is provided with a power taking contact assembly, a circuit board and a power supply connector that are electrically connected to each other, the mounting base is provided with a first fastening surface, and the fastener is provided with a second fastening surface opposite to the first fastening surface, the fastener and the mounting base are threadedly connected to adjust the distance between the first fastening surface and the second fastening surface. The electrical supply plug is applicable to support arms of different thickness by changing the connection mode, thereby improving the installation flexibility and application range of the electrical supply system.

14 Claims, 5 Drawing Sheets

(56) References Cited

U.S. PATENT DOCUMENTS

| | | | | |
|---|---|---|---|---|
| 5,425,648 | A * | 6/1995 | Farham | H01R 25/16 |
| | | | | 439/116 |
| 7,367,848 | B2 * | 5/2008 | John | H01R 13/5202 |
| | | | | 439/320 |
| 7,419,313 | B2 * | 9/2008 | Jablonski | H01R 13/746 |
| | | | | 385/92 |
| 9,130,326 | B2 * | 9/2015 | Meis | A47B 97/00 |
| 9,360,196 | B2 * | 6/2016 | Nicieja | F21V 21/35 |
| 9,819,107 | B2 * | 11/2017 | Logan, Jr. | H01R 12/91 |
| 9,883,756 | B2 * | 2/2018 | Kraiss | A47F 11/10 |
| 10,732,026 | B1 * | 8/2020 | Danenberg | G01G 21/00 |
| 10,980,362 | B2 * | 4/2021 | Ford | F21S 8/066 |
| 2008/0043456 | A1 * | 2/2008 | Bernardini | F25D 25/02 |
| | | | | 362/94 |
| 2013/0242561 | A1 * | 9/2013 | Kramer | H01R 25/142 |
| | | | | 362/253 |
| 2016/0043509 | A1 * | 2/2016 | Reeves | H01R 13/6582 |
| | | | | 439/374 |
| 2019/0386469 | A1 * | 12/2019 | Laurino | G01R 21/06 |

\* cited by examiner

EMBEDDED ELECTRICAL SUPPLY PLUG, ELECTRICAL SUPPLY SUPPORT ARM, AND RACK ELECTRICAL SUPPLY SYSTEM

RELATED APPLICATION

This application claims priority to a Chinese Patent Application No. CN 201910785832.1, filed on Aug. 23, 2019.

FIELD OF THE TECHNOLOGY

The present invention relates to the field of shelf power supply, with particular emphasis on an embedded electrical supply plug, a electrical supply support arm and a rack electrical supply system.

BACKGROUND OF THE INVENTION

Shelves have a wide range of uses, such as in shopping malls, logistics warehousing, factory warehouses, etc., all need shelves to store items that are being sold or are not used immediately. These shelves need to be illuminated in some occasions, especially those used in shopping malls, which not only need lighting, but also have particularly high requirements for lighting, such as space saving, convenient assembly, safety, beauty and so on.

In the prior art, a power source for supplying power to an LED lamp provided on a shelf illuminating surface is generally provided on a backlight surface of the shelf. Therefore, LED lamps shall be connected to the power supply by threading or winding wires from the exposed surface of the shelf to reach the backlight surface of the shelf. On the one hand, such a power supply setting method in the prior art leads to inconvenient drawing of wires, a lot of wiring, and clutter, which is not conducive to maintenance and aesthetics, and affects the product irradiation effect. On the other hand, because the shelves are required to have a large versatility to be able to place different kinds of goods, the installation position of the layer boards that need to be placed on the shelves for placing the goods can be changed accordingly, or the layer boards need to be removed or replaced.

In order to solve the above problems, there are also some power taking devices on the market to facilitate the installation of LED lights, but in actual use, there is still a problem of low adaptability.

BRIEF SUMMARY OF THE INVENTION

In view of this, the present invention provides an embedded electrical supply plug, an electrical supply support arm and a rack electrical supply system to solve the above technical problems.

An embedded electrical supply plug, comprising a mounting base and a fastener connected to each other, wherein the mounting base is provided with a power taking contact assembly, a circuit board and a power supply connector that are electrically connected to each other, characterized in that, the mounting base is provided with a first fastening surface, and the fastener is provided with a second fastening surface opposite to the first fastening surface, the fastener and the mounting base are threadedly connected to adjust the distance between the first fastening surface and the second fastening surface.

advantageously, the mounting base comprises:

a circuit board mounting groove, used for setting the circuit board, the outer periphery of a bottom surface extends outward to form the first fastening surface, and a outer surface is provided with external thread;

a power taking inserting board, fixedly connected to one side of the circuit board mounting groove and used for setting the power taking contact assembly.

advantageously, the fastener is a rotating cover, and an inner side of the fastener is provided with an internal thread that cooperates with the external thread.

advantageously, the power supply connector is a socket disposed in the circuit board mounting groove above the circuit board.

advantageously, a through hole is provided in the middle of the rotating cover to avoid the power supply connector.

advantageously, the power supply connector comprises a pin fixedly connected to the circuit board and an outer cover fixed above the pin.

advantageously, the power taking contact assembly comprises:

positive conductive piece and negative conductive piece, disposed in the power taking inserting board and one end of each is connected to the circuit board;

and positive power taking contact and negative power taking contacts, movably installed in the power taking inserting board and connected to the other ends of the positive conductive piece and negative conductive piece, and the free ends extend out of the power taking inserting board.

advantageously, the positive power taking contact and negative power taking contact are rod-shaped, both ends are free ends and protrude from the power taking inserting board, and the middle part is rotatably installed on the positive conductive piece and negative conductive piece, so that when one of the free ends of each is moved back into the power taking inserting board and the other is moved in the direction of extending the power taking inserting board.

A electrical supply support arm, comprising a support arm body provided on a column of a shelf and at least one embedded electrical supply plug provided on the support arm body.

advantageously, the support arm body comprises two claws arranged up and down, and an opening for mounting the embedded electrical supply plug is provided between the two claws, and the power taking inserting board is located between the two claws.

A rack electrical supply system, comprising at least one column, a power strip support frame fixed in each of the columns, and positive power supply bar and negative power supply bar provided on each power strip support frame, at least one support arm body provided on the column, and at least one embedded electrical supply plug provided on the support arm body, the power taking contact assembly of the embedded electrical supply plug is connected to the positive power supply bar and negative power supply bar.

advantageously, the column is provided with a plurality of bracket mounting holes arranged in a height direction, and the support arm body includes two claws arranged up and down and cooperating with the bracket mounting holes, and an opening for installing the embedded electrical supply plug is provided between the two claws, the power taking inserting board is located between the two claws, and the power taking contact assembly is connected to the positive power supply bar and negative power supply bar through the bracket mounting holes.

advantageously, the power strip support frame comprises:

a conductive strip setting plate, a width direction of the conductive strip setting plate is perpendicular to a plane on which the bracket mounting hole is located, and two conductive strip mounting grooves are arranged in parallel and spaced apart along the width direction;

a support profile, fixed on the conductive strip setting plate and the end is close to the inner surface of the column.

advantageously, the support profile comprises limit plates fixed to the conductive strip setting plate at intervals, and the conductive strip setting plate and the limiting plate form a card slot aligning with the bracket mounting hole, and the card slot is matched with the power taking inserting board.

advantageously, one side of the column is provided with double rows of bracket mounting holes, and two sides of the conductive strip setting plate are provided with conductive strip mounting grooves and are respectively provided with a set of positive power supply bar and negative power supply bar corresponding to two row of bracket mounting holes.

Technical Effects of the Invention

The embedded electrical supply plug, the electrical supply support arm and the rack electrical supply system of the present invention make the electrical supply plug applicable to the support arm of different thickness by changing the connection mode, thereby improving the installation flexibility and application range of the electrical supply system.

BRIEF DESCRIPTION OF THE DRAWINGS

The following describes embodiments of the present invention with reference to the accompanying drawings, in which.

DETAILED DESCRIPTION OF THE INVENTION

Hereinafter, specific embodiments of the present invention will be described in further detail based on the drawings. It should be understood that the description of the embodiments of the present invention is not intended to limit the protection scope of the present invention.

As shown in FIG. 1 to 7, the embedded electrical supply plug 1000 of this embodiment comprises a mounting base 100 and a fastener 200 that are connected to each other. The mounting base 100 is provided with a power taking contact assembly 300, a circuit board 400 and a power supply connector 500 that are electrically connected to each other. The mounting base 100 is provided with a first fastening surface 101 and the fastener 200 is provided with a second fastening surface 201 opposite to the first fastening surface 101. The fastener 200 is threadedly connected to the mounting base 100 to adjust the distance between the first fastening surface 101 and the second fastening surface 201.

Figure 1:
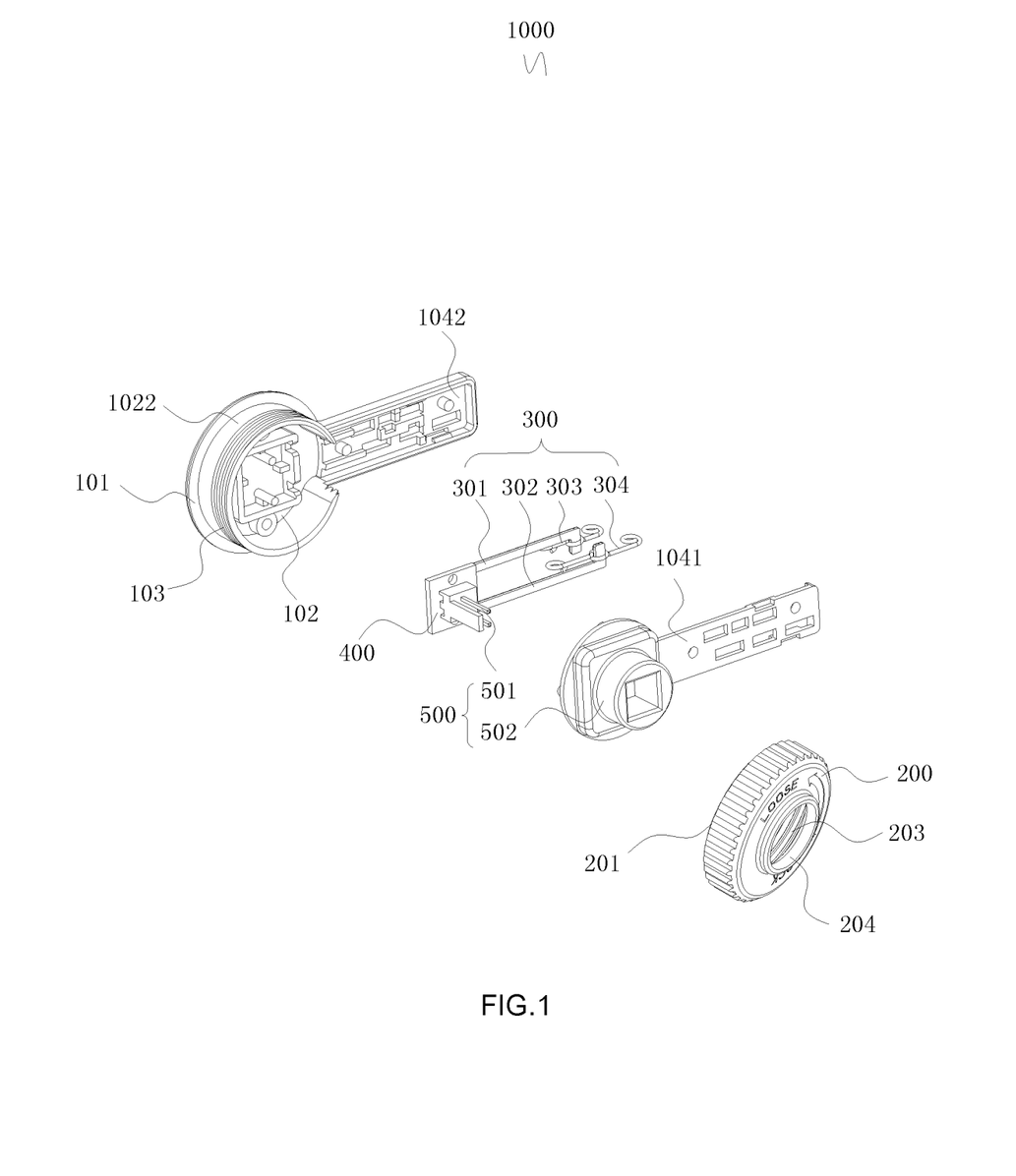
FIG. 1 is an exploded view of the embedded electrical supply plug of this embodiment.
Figure 2:
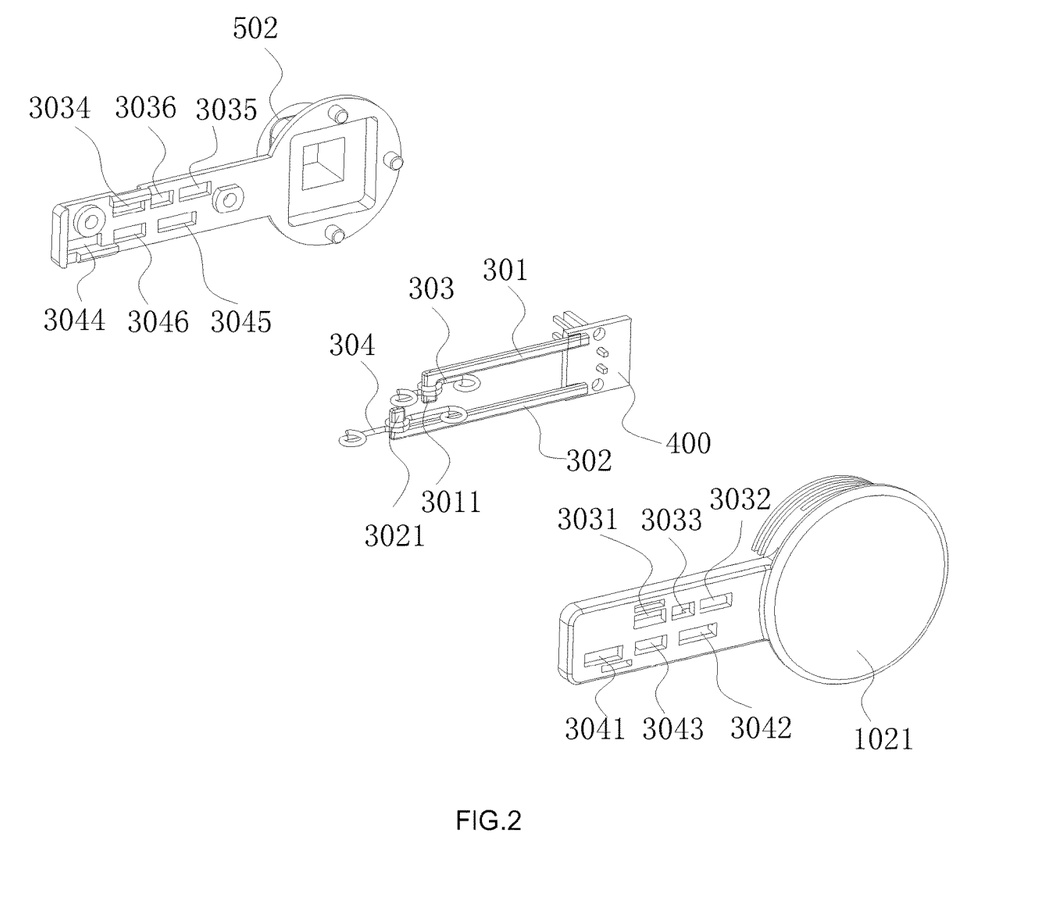
FIG. 2 is an exploded view of the embedded electrical supply plug (with fasteners omitted) of this embodiment.

In this embodiment, by providing a fastener 200 and a mounting base 100 that are threadedly connected, the embedded electrical supply plug can be fixed to the bracket arm body 600 with different thicknesses, thereby increasing the scope of application. There are a lot of forms that can be adopted for the power taking contact assembly 300, as long as the electrical connection with the power supply track is realized after the embedded electrical supply plug is installed, the power supply connector 500 can be used in a variety of forms such as wire, plug or socket. For ease of use and simple appearance, the power supply connector 500 in this embodiment is a socket provided in the circuit board mounting groove 102 above the circuit board 400, and the socket includes pins 501 fixedly connected to the circuit board and an outer cover 502 fixed above the pins 501. When power is required, the plug 800 is connected to the socket. The plug 800 is directly connected to a consumer, such as an LED lamp.

In order to simplify the structure and facilitate the installation, the mounting base 100 of this embodiment includes a circuit board mounting groove 102 and a power taking inserting board 104. The circuit board mounting groove 102 is used to set the circuit board 400, and the outer periphery of the bottom surface 1021 extends outward to form the first fastening surface 101. The outer surface 1022 is provided with external threads 103. The power taking inserting board 104 and one side of the circuit board mounting groove 102 is fixedly connected, and is used to set the power taking contact assembly 300. In the mounting base 100 with the above structure, the circuit board mounting groove 102 is used as an embedded and fixed part to make the structure more compact. The power take-in board 104 is used to set the power-taking contact assembly 300, which is more convenient to cooperate with the conductive strip in the column.

In order to facilitate manufacturing and installation, the fastener 200 is a rotating cover, and the inner side 202 of the rotating cover is provided with an internal thread 203 that cooperates with the external thread 103. For ease of use, a through hole 204 is provided in the middle of the rotating cover for the outer cover of the socket to pass through.

The structure of the power taking contact assembly 300 can adopt existing technology, such as a pin-type power taking head, etc. In order to improve the power take-in stability, the power taking contact assembly 300 of this embodiment includes positive conductive piece 301, negative conductive piece 302, and positive power contact 303, negative power contact 304.

Both the power take-in and the power supply have positive and negative paths. In this application, the structures are basically the same, so they are described together.

The positive conductive pieces 301 and negative conductive pieces 302 are disposed in the power taking inserting board 104 and one end is connected to the circuit board 400; the positive power taking contact 303 and negative power taking contact 304 are movably installed in the power taking inserting board 104 and connected to the other ends of the positive conductive piece 301 and negative conductive piece 302, and the free ends extend out of the power taking inserting board 104. Holes or strip-shaped grooves can be provided on the power taking inserting board 104 for the positive power taking contact 303 and negative power taking contact 304 to extend and return.

In order to improve the power taking stability, in this embodiment, the positive power taking contact 303 and negative power taking contact 304 are rod-shaped, the two ends are free ends and extend out of the power taking inserting board 104, and the middle part is rotatably installed on the positive conductive piece 301 and negative conductive piece 302, so that when one of the free ends of each is moved back into the power taking inserting board 104 and the other is moved in the direction of extending the power taking inserting board 104.

When the power taking contact assembly 300 of the above structure is in use, the distal end of the positive power taking contact 303 is connected to the positive power supply bar 702, and the proximal end abuts on the mounting frame where the positive power supply bar 702 is located. On the one hand, the rod-shaped structure has a certain degree of elasticity. On the other hand, the interaction between the two free ends can ensure that the distal end has good electrical conductivity. The distal end and the proximal end respectively refer to a distance from the circuit board 400.

Both ends of the positive power taking contact 303 and negative power taking contact 304 are circular rings. Of course, they can also be other shapes, such as triangles, as long as they do not obstruct the movement of the plug. However, the circular rings are convenient for processing and forming, and seesaw movement occurs when the power taking contacts are inserted into the track.

Figure 3:
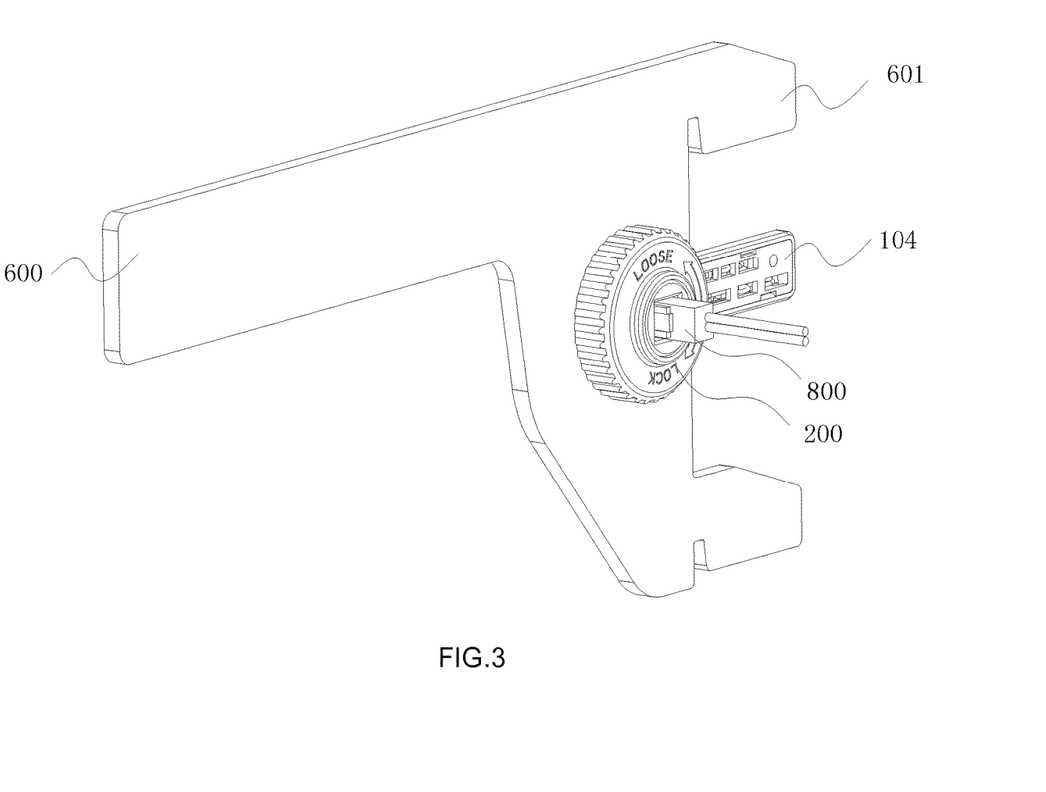
FIG. 3 is a schematic diagram of the three-dimensional structure of the electrical supply support arm of this embodiment.
Figure 4:
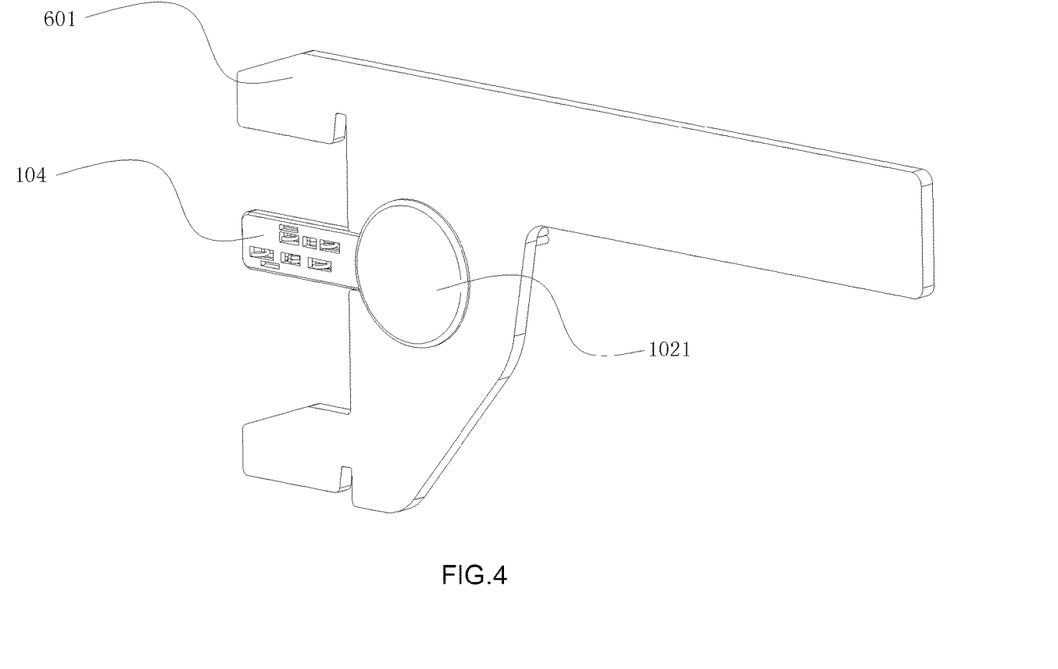
FIG. 4 is a perspective structural view of the electrical supply support arm of this embodiment at another angle.

The embedded electrical supply plug 1000 of this embodiment can be integrated into a electrical supply support arm, including a support arm body 600 provided on the column 700 of a shelf and at least one embedded electrical supply plug 1000 provided on the support arm body 600.

After the support arm body 600 is mounted on the column 700, the embedded electrical supply plug 1000 is also connected to the power supply bar.

Figure 5:
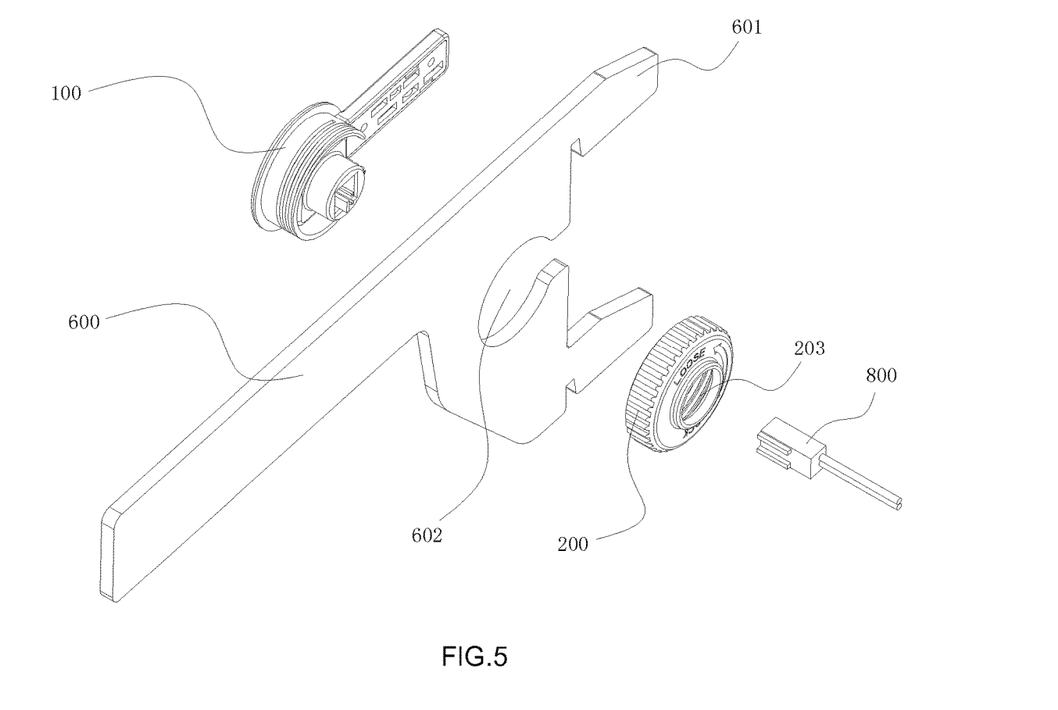
FIG. 5 is a schematic perspective view of the three-dimensional structure of the electrical supply support arm according to this embodiment without being installed.

In order to improve the stability of installation, the supporting arm body 600 includes two claws 601 arranged on top and bottom, and an opening 602 for mounting the embedded electrical supply plug 1000 is provided between the two claws 601, and the power taking inserting board 104 is located between the two claws 601.

During installation, the circuit board mounting groove 102 is embedded in the opening 602, and the first fastening surface 101 and the edge of the opening 602 abut against each other. Then, the rotary cover is mounted on the circuit board mounting groove 102. After locking, the first fastening surface 101 and the second fastening surface 201 clamps the support arm body 600 to complete the installation, and the power taking inserting board 104 is located between the two claws 601. Therefore, the power taking inserting board 104 can be installed on the support arm body 600 with different thicknesses, thereby improving the application range.

Figure 6:
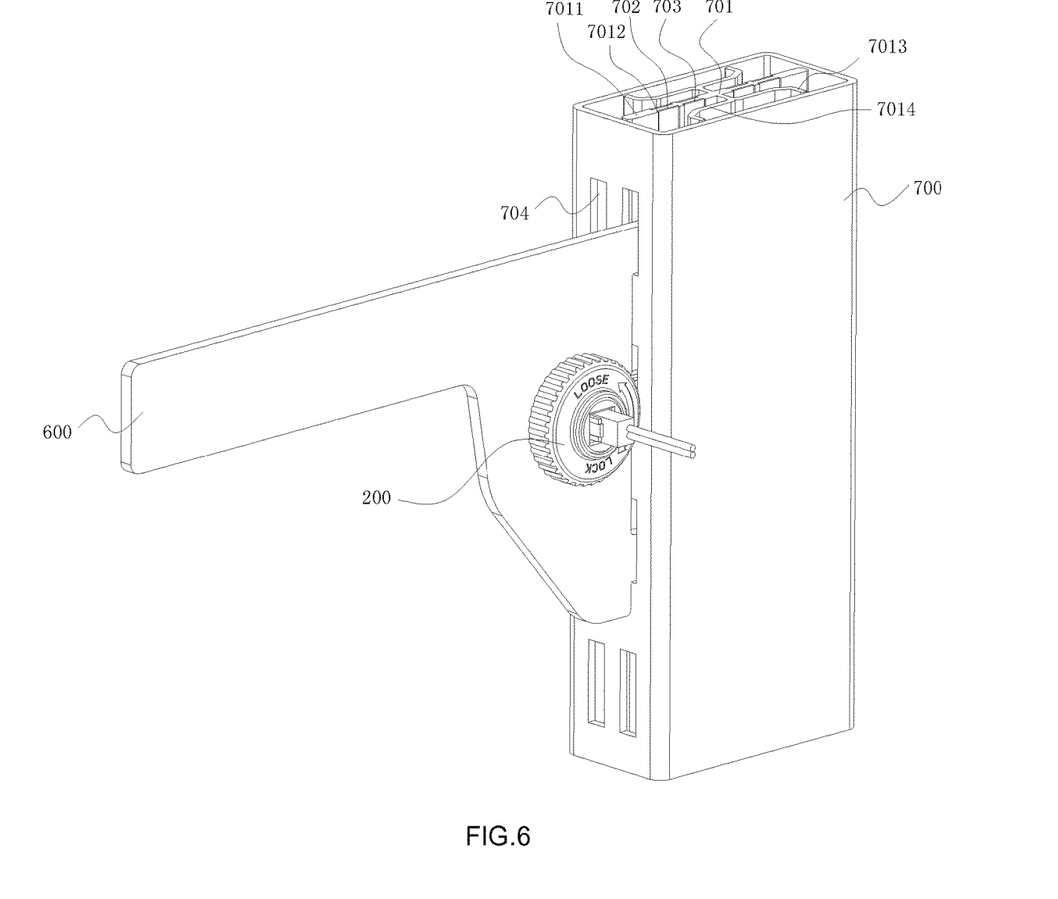
FIG. 6 is a three-dimensional structure diagram of the rack electrical supply system of this embodiment.
Figure 7:
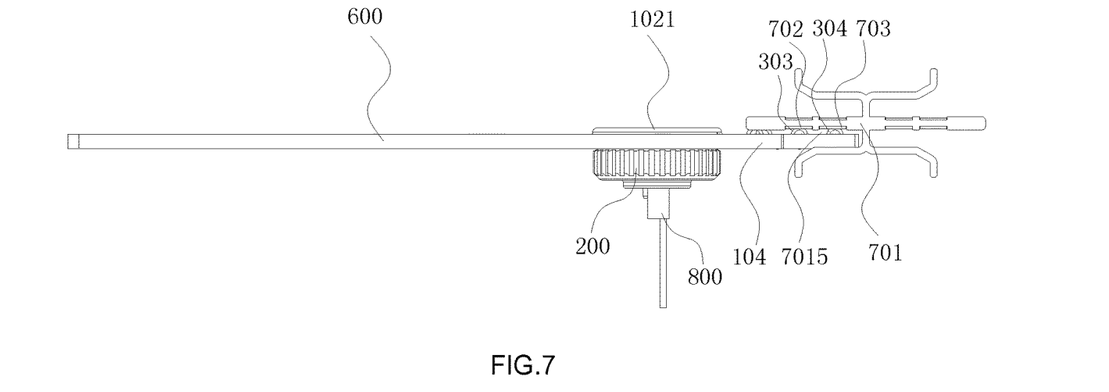
FIG. 7 is a schematic structural diagram of a rack electrical supply system of this embodiment.

The embedded electrical supply plug 1000 of this embodiment can also be integrated into a rack electrical supply system, including at least one column 700, a power strip support frame 701 fixed in each of the columns 700, and positive power supply bar 702 and negative power supply bar 703 provided on each power strip support frame 701, at least one support arm body 600 provided on the column 700, and at least one embedded electrical supply plug 1000 provided on the support arm body 600. The power taking contact assembly 300 of the embedded electrical supply plug 1000 is connected to the positive power supply bar 702 and negative power supply bar 703.

The column 700 is provided with a plurality of bracket mounting holes 704 arranged in a height direction. The support arm body 600 includes two claws 601 arranged on top and bottom and cooperating with the bracket mounting holes 704. An opening 602 is arranged between the two claws 601 for installing the embedded electrical supply plug 1000. The power taking inserting board 104 is located between the two claws 601, and the power taking contact assembly 300 is connected to the positive power supply bar 702 and negative power supply bar 703 through the bracket mounting holes 704.

In general, the positive power supply bar 702 and negative power supply bar 703 extend along the length direction of the column 700 and are arranged side by side at intervals. The positive power supply bar 702 and negative power supply bar 703 are at a distance from the bracket mounting hole 704. Therefore, the positive power taking contact 303 and negative power taking contact 304 are also arranged back and forth. Specifically, the positive conductive piece 301 and negative conductive piece 302 are arranged parallel to each other and spaced apart and the extending direction is perpendicular to the positive power supply bar 702 and negative power supply bar 703. The free ends of the positive conductive piece 301 and negative conductive piece 302 are away from the circuit board 400 has a distance difference, and the free ends of the positive conductive piece 301 and negative conductive piece 302 are bent inward to form positive mounting shaft 3011 and negative mounting shaft 3021.

In this embodiment, the rod-shaped positive power taking contact 303 and negative power taking contact 304 are formed by bending metal rods, the two free ends are bent into a circle, and the middle part is wound on the positive mounting shaft 3011 and negative mounting shaft 3021. The power taking inserting board 104 is formed by buckling the upper cover 1041 and the lower cover 1042, wherein the upper cover 1041 is connected to the outer cover 502, the lower cover 1042 is connected to the circuit board mounting groove 102, and the lower cover 1042 is provided with the first in and out hole 3031, the second in and out hole 3032, the fifth in and out hole 3041 and the sixth in and out hole 3042 for the free ends of the positive power taking contact 303 and negative power taking contact 304 to extend out. In order to avoid the protrusions in the middle of the positive power taking contact 303 and negative power taking contact 304, the lower cover 1042 is provided with the first mounting hole 3033 and the third mounting hole 3043. At the same time, the upper cover 1041 is provided with corresponding the third in and out hole 3034, the fourth in and out hole 3035, the seventh in and out hole 3044, the eighth in and out hole 3045, the second mounting hole 3036 and the fourth mounting hole 3046.

In this embodiment, the power strip support frame 701 includes a conductive strip setting plate 7011 and a support profile 7013; a width direction of the conductive strip setting plate 7011 is perpendicular to a plane on which the bracket mounting hole 704 is located, and the conductive strip setting plate 7011 is provided with two conductive strip mounting grooves 7012 parallel to and spaced along the width direction; two conductive strip mounting grooves 7012 are respectively used to install positive power supply bar 702 and negative power supply bar 703; The support profile 7013 is fixed on the conductive strip setting plate 7011 and the end is close to the inner surface of the column 700. The role of the support profile 7013 is to prevent the power strip support frame 701 from shaking in the column 700, and at least four directions of forward, backward, left, and right radial extension to the vicinity of the inner surface of the column 700. Overall, it's still clearance fit.

In order to further improve the reliability of electricity, the support profile 7013 includes limit plates 7014 fixed on the conductive strip setting plate 7011 at intervals. The conductive strip setting plate 7011 and the limiting plate 7014 form a card slot 7015 aligning with the bracket mounting hole 704. The card slot 7015 is matched with the power taking inserting board 104.

In order to use the power taking inserting board 104 in formal or reverse installation, one side of the column 700 is provided with two rows of bracket mounting holes 704, and two sides of the conductive strip setting plate 7011 are provided with conductive strip mounting grooves 7012 and are respectively provided with a set of positive power supply bar 702 and negative power supply bar 703 corresponding to two row of bracket mounting holes 704.

The above disclosure has been described by way of example and in terms of exemplary embodiment, and it is to be understood that the disclosure is not limited thereto. Rather, any modifications, equivalent alternatives or improvement etc. within the spirit of the invention are encompassed within the scope of the invention as set forth in the appended claims.

What is claimed is:

1. An embedded electrical supply plug, comprising:
a mounting base (100) and a fastener (200) connected to each other, wherein the mounting base (100) is provided with a power taking contact assembly (300),
a circuit board (400) and a power supply connector (500) that are electrically connected to each other,
wherein the mounting base (100) is provided with a first fastening surface (101), and the fastener (200) is provided with a second fastening surface (201) opposite to the first fastening surface (101), the fastener (200) and the mounting base (100) are threadedly connected to adjust the distance between the first fastening surface (101) and the second fastening surface (201);
the mounting base (100) comprises a circuit board mounting groove (102) used for setting the circuit board (400), an outer periphery of a bottom surface (1021) extends outward to form the first fastening surface (101), and an outer surface (1022) is provided with external threads (103); and
a power taking inserting board (104), fixedly connected to one side of the circuit board mounting groove (102) and used for setting the power taking contact assembly (300).

2. The embedded electrical supply plug as claimed in claim 1, wherein the fastener (200) is a rotating cover, and an inner side of the fastener (200) is provided with an internal thread (203) that cooperates with the external thread (103).

3. The embedded electrical supply plug as claimed in claim 2, wherein the power supply connector (500) is a socket disposed in the circuit board mounting groove (102) above the circuit board (400).

4. The embedded electrical supply plug as claimed in claim 3, wherein a through hole (204) is provided in the middle of the rotating cover to avoid the power supply connector (500).

5. The embedded electrical supply plug as claimed in claim 3, wherein the power supply connector (500) comprises a pin (501) fixedly connected to the circuit board and an outer cover (502) fixed above the pin (501).

6. The embedded electrical supply plug as claimed in claim 1, wherein the power taking contact assembly (300) comprises positive conductive piece (301) and negative conductive piece (302), disposed in the power taking inserting board (104) and one end of each conductive piece is connected to the circuit board (400);
and positive power taking contact (303) and negative power taking contacts (304), movably installed in the power taking inserting board (104) and connected to other ends of the positive conductive piece (301) and negative conductive piece (302), and free ends extend out of the power taking inserting board (104).

7. The embedded electrical supply plug as claimed in claim 6, wherein the positive power taking contact (303) and negative power taking contact (304) are rod-shaped, both ends are free ends and protrude from the power taking inserting board (104), and the middle part is rotatably installed on the positive conductive piece (301) and negative conductive piece (302), so that when one of the free ends of each is moved back into the power taking inserting board (104) and the other is moved in the direction of extending the power taking inserting board (104).

8. An electrical supply support arm, comprising a support arm body (600) provided on a column (700) of a shelf and at least one embedded electrical supply plug (1000) as claimed in claim 1 provided on the support arm body (600).

9. The electrical supply support arm as claimed in claim 8, wherein the support arm body (600) comprises two claws (601) arranged up and down, and an opening (602) for mounting the embedded electrical supply plug (1000) is provided between the two claws (601), and the power taking inserting board (104) is located between the two claws (601).

10. A rack electrical supply system, comprising at least one column (700), a power strip support frame (701) fixed in each of the columns (700), and positive power supply bar (702) and negative power supply bar (703) provided on each power strip support frame (701), at least one support arm body (600) provided on the column (700), and at least one embedded electrical supply plug (1000) as claimed in claim 1 provided on the support arm body (600), the power taking contact assembly (300) of the embedded electrical supply plug (1000) is connected to the positive power supply bar (702) and negative power supply bar (703).

11. The rack electrical supply system as claimed in claim 10, wherein the column (700) is provided with a plurality of bracket mounting holes (704) arranged in a height direction, and the support arm body (600) includes two claws (601) arranged up and down and cooperating with the bracket mounting holes (704), and an opening (602) for installing the embedded electrical supply plug (1000) is provided between the two claws (601), the power taking inserting board (104) is located between the two claws (601), and the power taking contact assembly (300) is connected to the positive power supply bar (702) and negative power supply bar (703) through the bracket mounting holes (704).

12. The rack electrical supply system as claimed in claim 10, wherein the power strip support frame (701) comprises:
a conductive strip setting plate (7011), a width direction of the conductive strip setting plate (7011) is perpendicular to a plane on which the bracket mounting hole (704) is located, and two conductive strip mounting grooves (7012) are arranged in parallel and spaced apart along the width direction;
a support profile (7013), fixed on the conductive strip setting plate (7011) and the end is close to the inner surface of the column (700).

13. The rack electrical supply system as claimed in claim 12, wherein the support profile (7013) comprises limit plates (7014) fixed to the conductive strip setting plate (7011) at intervals, and the conductive strip setting plate (7011) and the limiting plate (7014) form a card slot (7015) aligning with the bracket mounting hole (704), and the card slot (7015) is matched with the power taking inserting board (104).

14. The rack electrical supply system as claimed in claim 12, wherein one side of the column (700) is provided with double rows of bracket mounting holes (704), and two sides of the conductive strip setting plate (7011) are provided with conductive strip mounting grooves (7012) and are respectively provided with a set of positive power supply bar (702) and negative power supply bar (703) corresponding to two row of bracket mounting holes (704).

\* \* \* \* \*